United States Patent [19]
Nam

[11] Patent Number: 6,055,207
[45] Date of Patent: Apr. 25, 2000

[54] SYNCHRONOUS SEMICONDUCTOR MEMORY DEVICE HAVING A COLUMN DISABLING CIRCUIT

[75] Inventor: Ga-Pyo Nam, Taebaek-shi, Rep. of Korea

[73] Assignee: Samsung Electronics, Co., Ltd., Suwon, Rep. of Korea

[21] Appl. No.: 09/039,781

[22] Filed: Mar. 16, 1998

[30] Foreign Application Priority Data

Mar. 15, 1997 [KR] Rep. of Korea ......................... 97-8830

[51] Int. Cl.$^7$ ....................................................... G11C 8/00
[52] U.S. Cl. ............... 365/233; 365/189.05; 365/189.06; 365/230.03; 365/230.06
[58] Field of Search ........................ 395/834.05; 711/169; 365/230.03, 230.08, 233, 239, 189.05, 189.09, 230.06

[56] References Cited

U.S. PATENT DOCUMENTS

| | | | |
|---|---|---|---|
| 5,590,086 | 12/1996 | Park et al. ........................... | 365/230.03 |
| 5,742,554 | 4/1998 | Fujioka .................................... | 365/222 |
| 5,754,838 | 5/1998 | Shibata et al. ........................... | 395/559 |

*Primary Examiner*—David Nelms
*Assistant Examiner*—Thong Le

*Attorney, Agent, or Firm*—Marger Johnson & McCollom, P.C.

[57] ABSTRACT

Disclosed is a synchronous semiconductor memory device for prevent signals on activated and inactivated column selection lines from being overlapped, which comprises a memory cell array having at least two banks each divided into a plurality of blocks, each of the blocks having a plurality of memory cells arranged in form of matrix of a plurality of rows and columns; a timing register for generating an internal clock signal synchronized with an external clock signal; a column predecoder for decoding a column address for addressing one of the columns to generate a first address as block selection-information and a second address as column selection-information; a column decoder for selecting one of columns within block relevant to the first address in response to the second address synchronized with the Nth cycle (N is an integer) of the internal clock signal after disabling an addressed column at the (N−1)th cycle of the internal clock signal in response to a predetermined column disable signal; and a column selection line disabling circuit for generating the column disable signal only when the first address corresponding to column activated at the (N−1)th cycle of the internal clock signal is activated during the Nth cycle of the internal clock signal. With the device, even though the synchronous semiconductor memory device is operated at high speed, it is possible to prevent signals on each of the column selection lines activated and inactivated from being overlapped.

1 Claim, 4 Drawing Sheets

SYNCHRONOUS SEMICONDUCTOR MEMORY DEVICE HAVING A COLUMN DISABLING CIRCUIT

FIELD OF THE INVENTION

The present invention relates to a semiconductor memory device and, more particularly, to a synchronous semiconductor memory device having a circuit for disabling column selection lines.

BACKGROUND OF THE INVENTION

A synchronous semiconductor device may generate a plurality of data corresponding to a burst length. To realize it, in general, each of column selection lines in the memory device is activated and then inactivated. Column selection line (CSL) disabling circuits are provided in the synchronous semiconductor device, particularly in respective banks of the memory cell array so as to disable a selected CSL when read/write operation associated with the line is completed. So, whenever a column address is changed, CSLs to be addressed in accordance with column selection-information are activated after all the CSLs in an arbitrary bank are precharged. In case of using the above-mentioned scheme, a large amount of current is consumed during the operation of the device because all the column selection lines are precharged.

A prior art solution to this problem is seen in FIG. 5. A memory cell array 100 is divided into multiple banks (BANK1, BANK2). The column selection lines in a bank are divided to address a plurality of blocks BLK1, BLK2, and CSL disabling circuits are provided for the blocks, respectively. The row component of an external address XA is input in row buffer 110, and then to row decoder 120. Column address information is input into column buffer 30, and from there as CA' into column predecoder 40, where it is predecoded into DCA'. A block-specific component of the column address information DCA_BLK' is then assigned to a corresponding CSL disabling circuit 50. Accordingly, only the column selection lines in a block selected by signal CSL' are precharged. As a result, current consumption is reduced during the precharge operation.

In the conventional memory device, the CSL disabling circuit 50 receives a first address DCA_BANK' from the column address buffer 30 and the second address DCA_BLK' from the column predecoder 40, respectively. The first address, as bank selection-information, is used to select one of banks in the memory cell array. The second address, as block selection-information, is used to select one of blocks in the addressed bank.

Also, in response to the first and second addresses, the CSL disabling circuit generates a CSL line disable signal PCSLD' for disabling a selected CSL' for Nth cycle (N is an integer) of an internal clock signal PCLK from the timing register, before a CSL' to be selected during (N+1)th cycle of the internal clock signal PCLK is enabled. After disabling an enabled CSL' during Nth cycle of the internal clock signal PCLK, the column decoder selects a CSL' which is associated with the third address from the column predecoder during (N+1)th cycle of the internal clock signal PCLK.

As described above, however, the CSL disabling circuit 50 receives the first and second addresses and generates the signal PCSLD' synchronized with the internal clock signal PCLK. Since the first and second addresses are coded as logic signal, i.e. the CSL line disable signal PCSLD', the CSL disabling circuit will have a complicated configuration. Also, the bus lines for the first and second addresses related to each block may increase in number. These may cause a process time for generating the CSL line disable signal PCSLD' and the device size to be increased. Furthermore, there may be overlapped signals on each of the two CSLs which are activated and inactivated at Nth cycle and (N+1)th cycle of the internal clock signal PCLK, respectively, thereby lowering the reliability of the synchronous semiconductor memory device.

SUMMARY OF THE INVENTION

It is therefore an object of the invention to provide a synchronous semiconductor memory device capable of reducing the number of address bussing by using a decoded address signal as an input signal of a column select line (CSL) disable circuit.

It is another object of the present invention to provide a synchronous semiconductor memory device capable of preventing the signals on the activated and inactivated CSLs from being overlapped.

In order to attain the above objects, according to an aspect of the present invention, there is provided a synchronous semiconductor memory device including a memory cell array having at least two banks each divided into a plurality of blocks, wherein each of the blocks has a plurality of memory cells arranged in form of matrix of a plurality of rows and columns, a timing register for generating an internal clock signal synchronized with an external clock signal, and a column predecoder for generating a first address as block selection-information and a second address as column selection-information.

Furthermore, in the memory device, a column decoder selects one of columns within block relevant to the first address in response to the second address synchronized with Nth cycle (N is an integer) of the internal clock signal after disabling an addressed column at the (N−1)th cycle of the internal clock signal in response to a predetermined column disable signal. A CSL disabling circuit generates the column disable signal only when the first address corresponding to column activated at the (N−1)th cycle of the internal clock signal is activated during the Nth cycle of the internal clock signal.

As is apparent from the foregoing, according to the synchronous semiconductor memory device of the invention, the number of bus lines for the CSL disabling circuit can be reduced. Since the CSL disabling circuit is not complicated in configuration, it is possible to shorten a process time for generating the CSL disable signal in the CSL disabling circuit. Also, the overlapping of the signals on the activated and inactivated CSLs are prevented.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

It should be understood that the description of this preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 1:
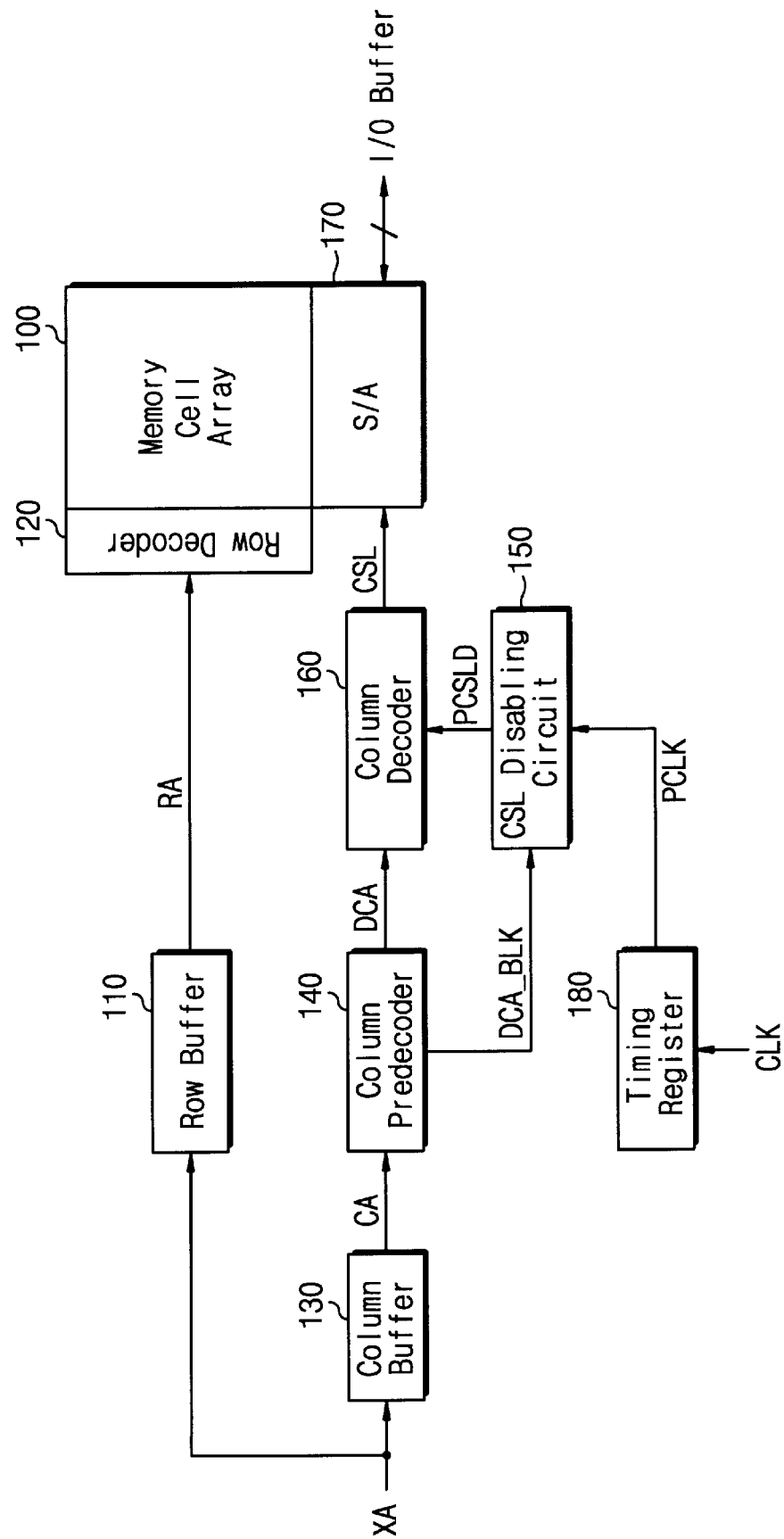
FIG. 1 is a block diagram showing configuration of a synchronous semiconductor memory device to which the present invention is implemented.
Figure 3:
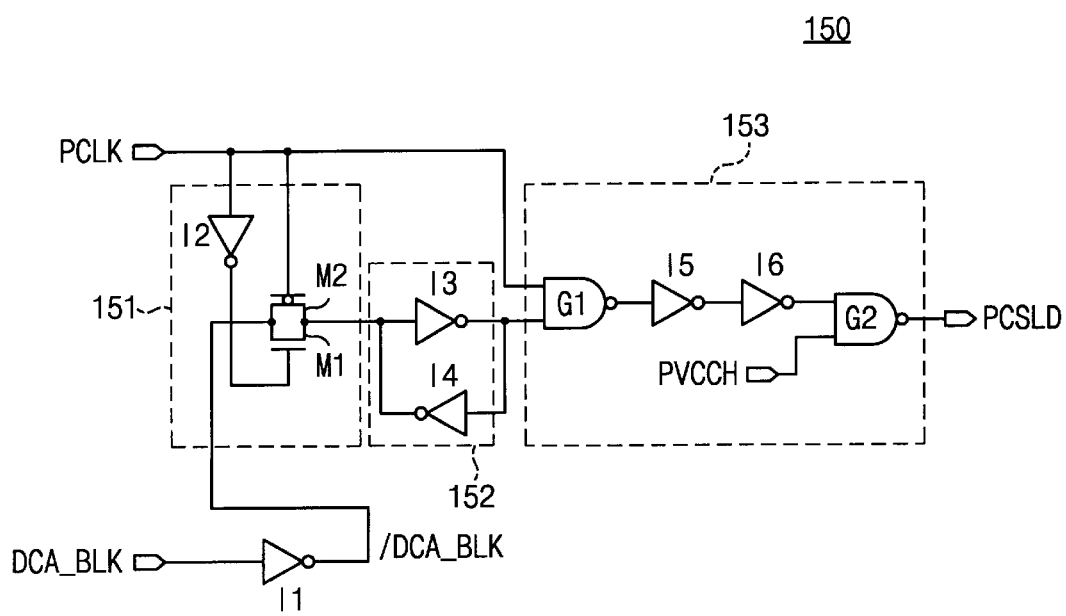
FIG. 3 is a detailed circuit diagram showing a CSL disabling circuit according to a preferred embodiment of the invention.

Referring to FIGS. 1 and 3, a novel synchronous semiconductor memory device in accordance with the invention comprises a CSL (column selection line) disabling circuit 150. This circuit 150 receives only one address DCA_BLK as a block selection-information synchronized with an internal clock signal PCLK, and then generates a column disable signal PCSLD only when the address DCA_BLK corresponding to a column activated at the (N−1)th cycle of the internal clock signal PCLK is activated during the Nth cycle of the internal clock signal PCLK. So, the number of bus lines for the CSL disabling circuit 150 can be reduced. The CSL disable signal PCSLD is activated more rapidly, as compared to the conventional art. This is because the CSL disabling circuit 150 is simplified in its configuration compared to the prior art. As a result, it is possible to prevent signals on the activated and inactivated column selection lines from being overlapped at high speed operation.

Referring again to FIG. 1, the synchronous semiconductor memory device of the invention comprises a memory cell array 100, a row address buffer 110, a row decoder 120, a column address buffer 130, a column predecoder 140, a CSL disabling circuit 150, a column decoder 160, a sense amplifier circuit 170, and a timing register 180.

The memory cell array 100 is, although not shown in FIG. 1, divided in at least two banks, each having a plurality of blocks. Each of the blocks is composed of a plurality of memory cells arranged in form of a matrix of rows and columns. The row decoder 120 is provided to select one of the rows in a corresponding bank in response to a row address RA from the row address buffer 110. Since detailed circuits of the buffer 110 and the decoder 120 are well known in this art, those descriptions will be omitted herein.

The column address buffer 130 receives an external address XA of TTL level and generates a column address CA of CMOS level. The column predecoder 140 decodes the column address CA to generate a first address DCA_BLK and a second address DCA. The first address DCA_BLK is used to select one of the blocks in the bank and the second address DCA is used to select one of the columns associated with the selected block.

The timing register 180 generates an internal clock signal PCLK in synchronization with an external clock signal CLK. Furthermore, though not shown, the timing register 180 receives a chip selection signal /CS, a row address strobe /RAS signal, a column address strobe /CAS signal, a write enable signal /WE and so on, and generates control signals for controlling the memory device having the configuration of FIG. 1.

After disabling a column selection line relevant to column of the selected block in response to a column disable signal PCSLD from the CSL disabling circuit 150 during the (N−1)th cycle of the internal clock signal PCLK, the column decoder 160 is provided to select one of the column selection lines associated with columns of the selected block for the Nth cycle of the internal clock signal PCLK. The CSL disabling circuit 150 generates the column disable signal PCSLD only when the first address DCA_BLK associated with a column activated during the (N−1)th cycle of the internal clock signal PCLK is activated during the Nth cycle of the internal clock signal PCLK. The sense amplifier circuit 170 senses and amplifies data of a memory cell addressed in accordance with the row and column addresses RA and CSL.

According to the above-mentioned device, even though the synchronous semiconductor memory device is operated at high speed, it is possible to prevent signals on each of the column selection lines activated and inactivated from being overlapped.

Figure 2:
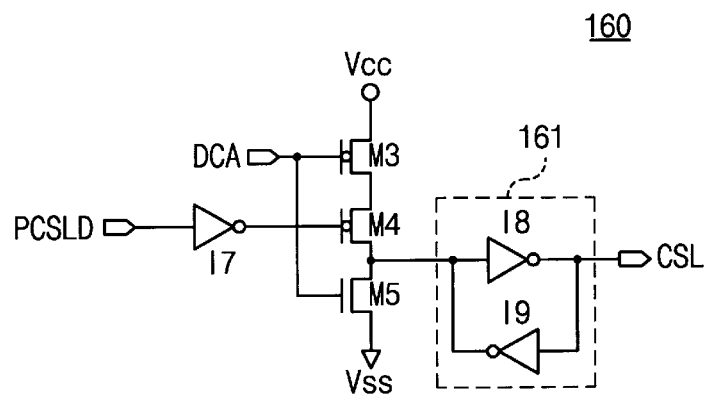
FIG. 2 is a detailed circuit diagram showing a column decoder of FIG. 1.

FIG. 2 is a circuit diagram showing a column decoder of FIG. 1. The column decoder 160 is composed of two PMOS transistors M3 and M4, an NMOS transistor M5 and a latch circuit 161. The latch circuit 161 has two inverters 18 and 19 latched to each other. And the latch circuit 161 is coupled to a column selection line CSL. As well known in the art, the column decoder 160 enables the column selection line CSL corresponding to the second address DCA, and disables the enabled column selection line CSL in response to the column selection line disable signal PCSLD.

FIG. 3 is a circuit diagram showing a CSL disabling circuit 150 according to a preferred embodiment of the invention. The CSL disabling circuit 150 is composed of an inverter I1, a switching circuit 151, a latch circuit 152 and a logic circuit 153. The latch circuit 152 composed of two inverters I3 and I4 is provided to latch a signal. In response to an internal clock signal PCLK from a timing register 180, the switching circuit 151 makes an inverse signal /DCA_BLK (indicating block selection-information) be transmitted through the inverter I1 to the latch circuit 152. The switching circuit 151 is comprised of an inverter I2, a NMOS transistor M1 and a PMOS transistor M2.

The logic circuit 153 generates a column selection line disable signal PCSLD in response to the internal clock signal PCLK as well as an output of the latch circuit 152. The circuit 153 has two NAND gates G1 and G2 and two inverters I5 and I6. An input signal PVCCH applied to the NAND gate G2 is always high level (e.g., a power supply voltage).

As above described, the CSL disabling circuit 150 of the invention receives a first address DCA_BLK as an input signal in response to the internal clock signal PCLK. In the conventional case, since bank selection information and block selection information are provided to a conventional CSL disabling circuit as input signals, the conventional CSL disabling circuit is very complicated in configuration. But, in case of the invention, since the block selection information only is provided to the disabling circuit 150 as an input signal, its configuration is more simplified in comparison to the conventional CSL disabling circuit. Accordingly, a time it takes to process the first address DCA_BLK and generate the column selection signal PCSLD by means of the column select line disabling circuit 150 can be considerably reduced.

Figure 4:
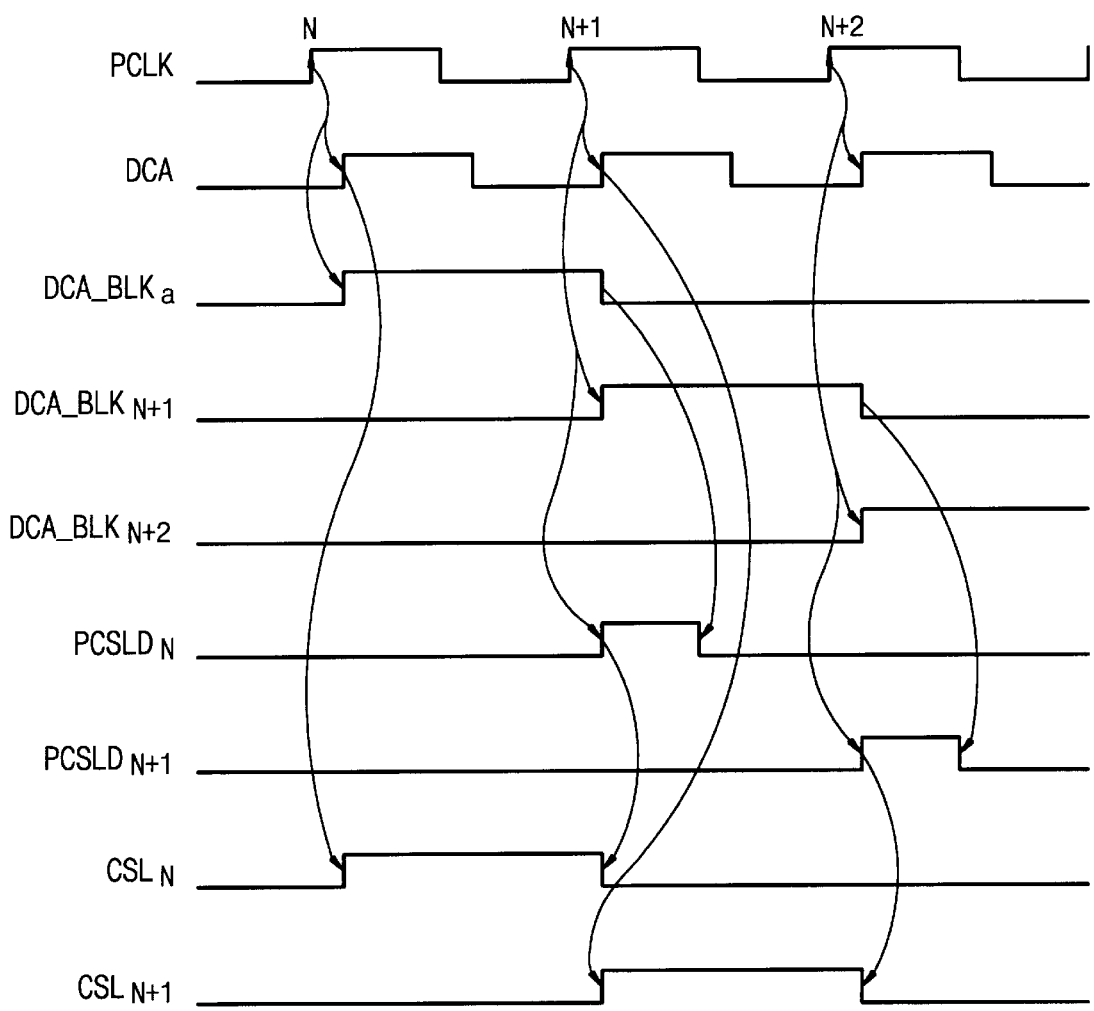
FIG. 4 is a timing diagram for explaining the operation of the synchronous semiconductor memory device according to the present invention.
Figure 5:
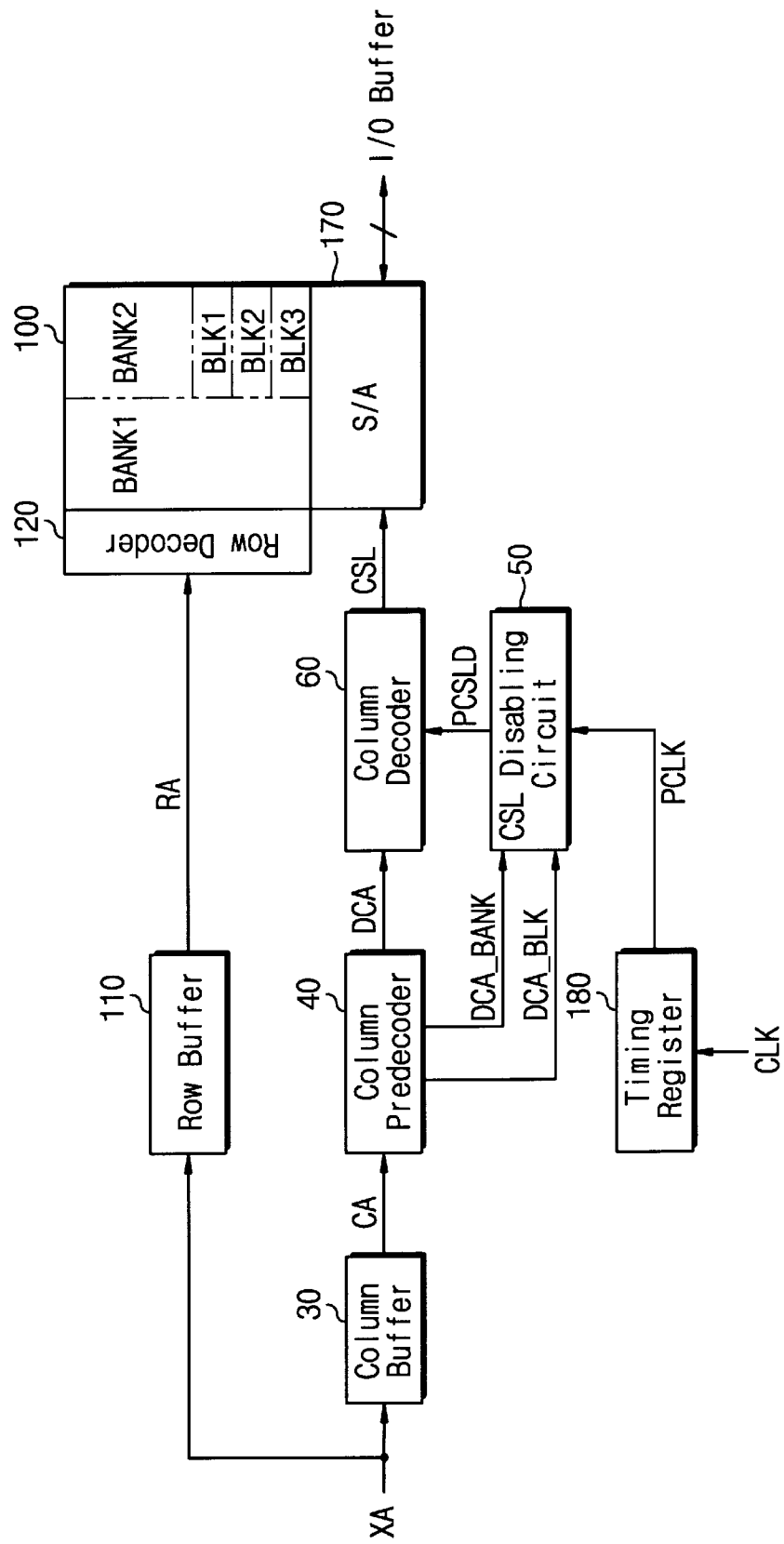
FIG. 5 is a block diagram of a synchronous semiconductor memory device in the prior art.

Operation of the present invention will be herein described with reference to FIGS. 1 through 4. FIG. 4 is a timing diagram of the memory device shown in FIG. 1.

During the Nth cycle of an internal clock signal PCLK, the column predecoder 140 decodes a column address CA from the column address buffer 130 to generate a first address $DCA\_BLK_N$ as block selection-information and a second address DCAN as column selection-information.

Herein, the subscript N means the Nth cycle of the internal clock signal PCLK. Then, the column decoder 160 selects one of a plurality of column selection lines in response to the second address $DCA_N$, which goes to high level. That is, as shown in FIG. 3, the NMOS transistor M5 of the column decoder 160 is turned-on by the second address DCAN of high level, and thus the high level signal is latched by the latch circuit 161. As a result, the column selection line $CSL_N$ corresponding to the second address DCAN is selected during the Nth cycle of the internal clock signal PCLK, as shown in FIG. 4.

During the interval of high state of the Nth internal clock signal PCLK, a first address $DCA\_BLK_{N-1}$ of low level synchronized with the (N−1)th internal clock signal $PCLK_N$. is latched by the latch circuit 152 of the circuit 150 because the switching circuit 151 of the CSL disabling circuit 150 is disabled. So, the logic circuit 153 generates the column selection line disable signal PCSLD of low level in response to the internal clock signal PCLK of high level and the output (i.e., low level) of the latch circuit 152. Then, since the column selection line disable signal PCSLD is at low level, the PMOS transistor M4 of the column decoder 160 is turned-off. Thus, during the high level interval of the Nth internal clock signal $PCLK_N$, the column selection line $CSL_N$ associated with the second address $DCA_N$ continues to be maintained to an enable state.

The first address DCA_BLK of high level is then latched by the latch circuit 152, when the Nth internal clock signal $PCLK_N$ goes from high level to low level, as shown in FIG. 4. And the logic circuit 153 generates the column selection line disable signal PCSLD having the same level as that of the Nth internal clock signal $PCLK_N$. Consequently, the activated column selection line $CSL_N$ continues to be maintained to the enable state while the internal clock signal PCLK of Nth cycle keeps at low level.

When the Nth internal clock signal PCLK goes to high level, the latch circuit 152 latches high level of the fist address latched at the Nth cycle of the clock signal PCLK. At this time, the first address $DCA\_BLK_{N+1}$ corresponding to the (N+1)th becomes high level, and thus the logic circuit 153 of the CSL disabling circuit 150 generates the column selection line disable signal PCSLD of high level. And the signal PCSLD of high level is inverted to low level.

Also, the two PMOS transistors M3 and M4 is turned-on and the NMOS transistor M5 is turned-off, because both of the second address DCAN corresponding to the Nth internal clock signal PCLK and the signal PCSLD are at low level. The latch circuit 161 connected to the column selection line CSL latches low level, and causes the column selection line CSL enabled at the Nth internal clock signal PCLK to be disabled before a column selection line CSL corresponding to the first and second addresses DCA_BLK and DCA of the (N+1)th cycle is enabled. The disabled column selection line CSL corresponds to the first and second addresses DCA_BLK and DCA is enabled at the Nth cycle of the internal clock signal PCLK. That is, the column selection line disable signal PCSLD is generated from the disabling circuit 150 only when the first address DCA_BLK corresponding to the column activated during the Nth cycle of the internal clock signal PCLK is activated during the (N+1)th cycle of the internal clock signal PCLK. A column selection line $CSL_{N+1}$ is then enabled according to a second address $DCA_{N+1}$ synchronized with the (N+1)th internal clock signal PCLK.

According to the above description for the invention, before the column selection line CSL enabled at the (N+1)th cycle is selected, the column selection line CSL activated at the Nth cycle is disabled by the column decoder 150 to which the column selection line disable signal PCSLD is provided. As a result, even though the synchronous semiconductor memory device is operated at high speed, it is possible to prevent signals on each of the column selection lines activated and inactivated from being overlapped at high speed operation.

What is claimed is:

1. A synchronous semiconductor memory device comprising:

a memory cell array having at least two banks each being divided into a plurality of blocks, wherein each of the blocks has a plurality of memory cells arranged at intersections of a plurality of rows and a plurality of columns;

internal clock signal generating means for generating an internal clock signal synchronized with an external clock signal;

column address decoding means for decoding a column address for addressing one of the columns to generate a first address as block selection-information and a second address as column selection-information;

column selecting means for selecting one of the columns corresponding to the first address in response to the second address synchronized with a Nth cycle, wherein N is an integer, of the internal clock signal after disabling an addressed column at a (N−1)th cycle previous to the Nth cycle of the internal clock signal in response to a predetermined column disable signal that is distinct from the second address; and column disable signal generating means for generating the column disable signal only when the first address corresponding to column activated at the (N−1)th cycle of the internal clock signal is activated during the Nth cycle of the internal clock signal, wherein said column disable signal generating means comprises:

a latch circuit for latching a signal;

a switching circuit for transferring the first address to the latch circuit in response to the internal clock signal; and a logic circuit for mixing the internal clock signal and the first address applied through the switching circuit, the logic circuit outputting the column disable signal in accordance with the mixed result.

* * * * *